May 18, 1965 J. A. CARLSON ETAL 3,184,543

HINGEDLY JOINED TELEVISION CABINET THAT PROVIDES FOR FRONT AND REAR EXPOSURE OF COMPONENTS

Filed Feb. 23, 1961 3 Sheets-Sheet 1

INVENTORS:
Joseph A. Carlson
Dominick A. Massa
By Hofgren, Brady, Wegner, Allen & Stellman, Att'ys INVENTORS:
Joseph A. Carlson
Dominick A. Massa
By Hofgren, Brady,
Wegner, Allen & Stellman
Att'ys INVENTORS:
Joseph A. Carlson
Dominick A. Massa
By
Att'ys United States Patent Office 3,184,543
Patented May 18, 1965

3,184,543
HINGEDLY JOINED TELEVISION CABINET THAT PROVIDES FOR FRONT AND REAR EXPOSURE OF COMPONENTS

Joseph A. Carlson, Glen Ellyn, and Dominick A. Massa, Arlington Heights, Ill., assignors to Warwick Electronics Inc., a corporation of Delaware Filed Feb. 23, 1961, Ser. No. 91,055
9 Claims. (Cl. 178—7.9)

This invention relates to a cabinet construction and more particularly to a cabinet for compactly housing electrical components such as a television system in which quick, simply obtained access may be had to the electrical components disposed in an extremely compact arrangement.

An object of this invention is to provide a new and improved cabinet structure for housing equipment, including electrical components permitting quick, simple access to the interior of the cabinet and the components disposed therein.

Further objects of the invention are to provide a cabinet of a minimum size dictated by the size of a television picture tube in which components are arranged about the picture tube to require a minimum amount of cabinet space and take advantage of the picture tube shape and to provide a new and improved implosion shield mount.

Another object of the invention is to provide a cabinet for housing electrical components comprising a pair of cabinet sections mounted for relative movement between positions opening and closing the cabinet with an internal mounting member for electrical components disposed in said cabinet with opposite sides of the member facing said sections of the cabinet, and means for moving said component mounting member with either of said cabinet sections individually whereby one side or the other of said member may be exposed when the cabinet is open.

Another object of the invention is to provide a television set having a pair of cabinet sections pivotally connected to form a cabinet with a picture tube mounted therein and attached to one of said sections, a chassis member pivotally connected to the casing sections and having a generally up and down disposition in the casing, and means providing for opening of the cabinet sections relative to each other with the chassis member attached to the rear cabinet section to permit access to vacuum tubes mounted at one side of the chassis member whereby a person may readily replace such vacuum tubes and also providing for release of the chassis member from the rear section whereby a service man may have ready access to circuitry mounted at the other side of the chassis member, said different attachments of the chassis member being quickly releasable from the exterior of the set.

Further objects and advantages will become apparent from the following detailed description taken in connection with the accompanying drawings in which.

Figures 1, 2, 3:
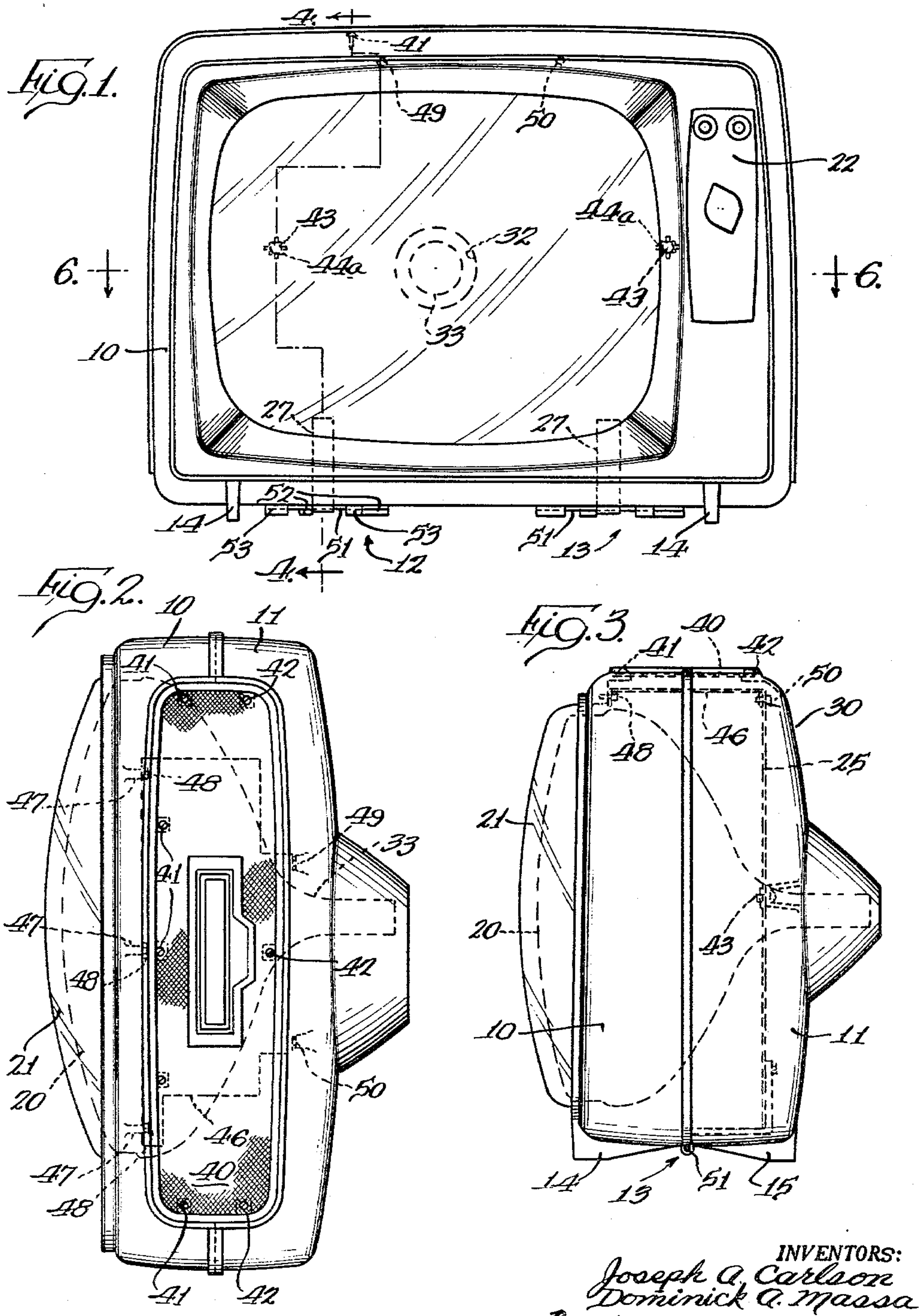
FIG. 1 is a front elevational view of a television set embodying the invention.
FIG. 2 is a top plan view of the structure shown in FIG. 1.
FIG. 3 is a side elevational view of the structure shown in FIG. 1 and taken looking toward the right-hand side of FIG. 1.

While this invention is susceptible of embodiments in many different forms, there is shown in the drawings and will herein be described in detail an embodiment of the invention with the understanding that the present disclosure is to be considered as an exemplification of the principles of the invention and is not intended to limit the invention to the embodiment illustrated. The scope of the invention will be pointed out in the appended claims.

The cabinet of our invention is shown in the drawings embodied in a television set, in which a pair of cabinet sections 10 and 11 are hingedly connected together along the bottom of the cabinet by hinges indicated generally at 12 and 13. The cabinet is shown in FIGS. 1 to 3 with the front section 10 and the rear section 11 in close-fitting relation to close off the interior of the cabinet and the bottoms of both cabinet sections have projections 14 and 15 providing a base for the set.

Figures 4, 5:
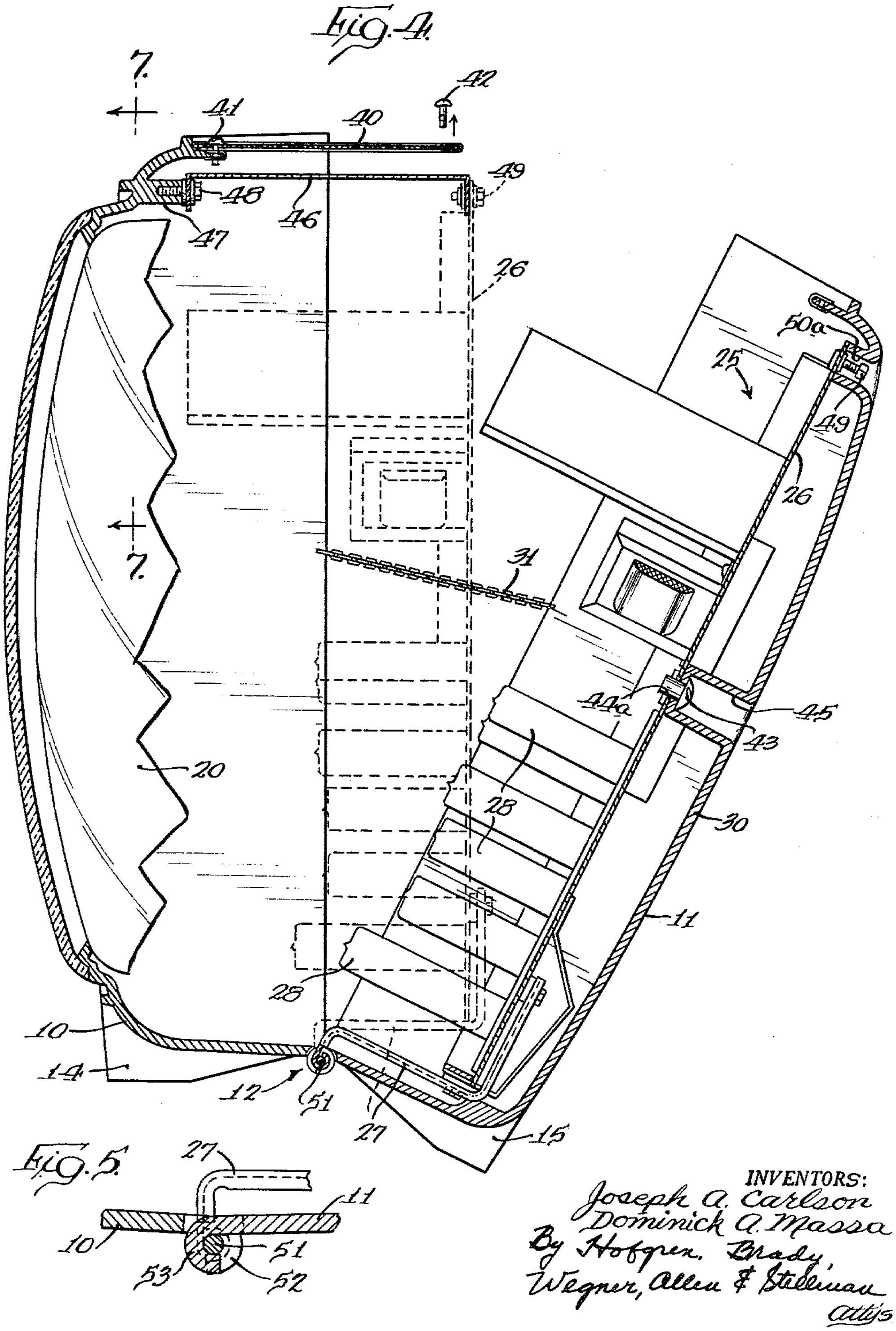
FIG. 4 is a vertical section on an enlarged scale taken generally along the line 4—4 in FIG. 1 with the cabinet shown in open position and with a chassis member shown in alternate position in broken line.
FIG. 5 is a fragmentary detail view showing the hinge construction for the cabinet.
Figure 6:
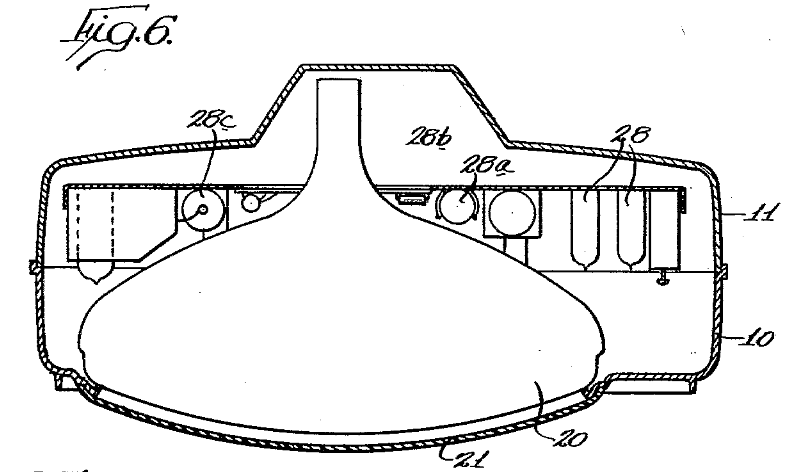
FIG. 6 is a horizontal section taken generally along the line 6—6 in FIG. 1.
Figure 7:
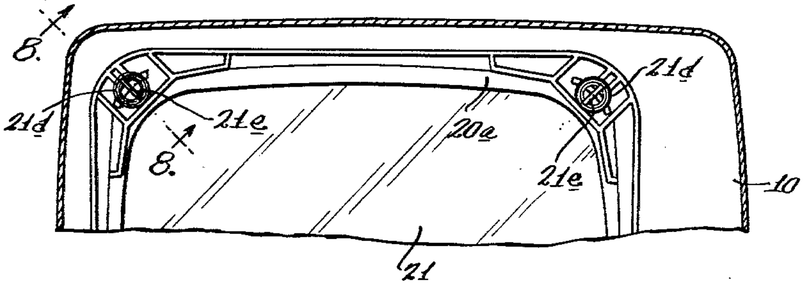
FIG. 7 is a vertical fragmentary section taken generally along the line 7—7 in FIG. 4.
Figure 8:
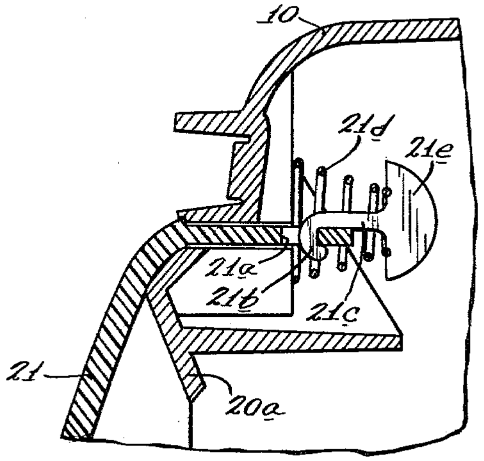
FIG. 8 is an enlarged fragmentary section taken generally along the line 8—8 in FIG. 7.

The front section 10 of the cabinet mounts a picture tube 20 which is shown in FIG. 6 and broken away in FIG. 4 and in addition a safety screen or implosion shield 21 which shields the picture tube. A control panel 22 is also mounted on the front section 10. The picture tube 20 is mounted against a bezel 20*a* formed as part of the cabinet. As noted in FIGS. 6–8, the implosion shield 21 wraps around the bezel 20*a* and also functions as a valve. The valve action upon implosion is obtained by the yieldable spring mounting of the shield at the four corners thereof. Each mounting embodies an opening 21*a* in the shield receiving a hook 21*b* on a headed member 21*c* with a spring 21*d* extended between the cabinet and a head 21*e* on the headed member 21*c*. If an implosion takes place, the reaction thereto will be a force outwardly of the cabinet which compresses the spring 21*d* to permit outward movement of the shield 21 which vents the cabinet.

A chassis 25 is disposed within the cabinet and has a plate 26 carrying a pair of hinge brackets at its lower end with one of the brackets indicated at 27 which pivotally mounts the chassis member within the cabinet. The chassis 25 normally has an upright disposition as shown in FIG. 3 and broken line in FIG. 4 whereby a plurality of vacuum tubes 28 are at a side of the chassis plate 26 and extend toward the front of the cabinet in generally close relation to the picture tube 20. With the picture tube having the shape, as shown in FIG. 6, it is possible to have a more compact cabinet by wrapping the components including the vacuum tubes 28 around the picture tube 20, as seen also in FIG. 4. Also, the height of the components is taken into account by having components 28*a* and 28*b* which are of a lesser height disposed around the neck of the picture tube where less space front-to-rear of the cabinet is required. In this area also, a vacuum tube 28*c* is turned on its side to utilize the limited space available.

Suitable circuits carried on the chassis are at the side of the plate 26 opposite to the vacuum tubes 28 and at the side thereof adjacent a back wall 30 of the cabinet rear section 11.

With the cabinet open as shown in full line in FIG. 4 and with the chassis 25 associated with the cabinet rear section 11, it will be seen that the vacuum tubes 28 are exposed for easy accessability by a set owner whereby the tubes may be exchanged without the need for a service call from a trained service man. This is accomplished without exposing the wiring since the wiring is within the space at the other side of the chassis plate 26. When a serviceman wishes to work on the circuitry of the set, the rear cabinet section 11 is disposed as shown in FIG. 4 and the chassis 25 is in the position shown in broken line in FIG. 4. The limit of relative movement between the cabinet sections is determined by a suitable connecting chain 31 which may be disconnected from the cabinet sections for a purpose more fully explained hereinafter.

The chassis plate 26 has a central opening 32, as viewed in FIG. 1, which surrounds a neck 33 of the picture tube and is sufficiently large to permit movement of the chassis to the full line position shown in FIG. 4 without interfering wtih the neck of the picture tube.

Means for releasably fastening the cabinet sections 10 and 11 together includes a foraminous screen 40 at the top of the cabinet which spans an opening formed between the cabinet sections. This screen is secured to the top of the front cabinet section 10 by a plurality of threaded members 41 and the screen is attached to the top of the rear cabinet section 11 by a plurality of threaded fasteners 42. Removal of the three threaded fasteners 42 releases the back cabinet section 11 from any attachment to the front cabinet section 10 and the cabinet sections may assume the full line position relative to each other as shown in FIG. 4.

The rear cabinet section 11 is releasably fastened to the chassis 25 by means including a pair of bolts with pins 43 which connect to chassis plate openings 44*a* as shown in FIGS. 1 and 4. Each of these bolts are fitted within a well 45 provided one for each thereof and are rotatable for attachment and release.

The chassis 25 is releasably fastened to the cabinet front section 10 by means including a bracket 46 extending across the top of the cabinet within the interior thereof and secured to a flange 47 on the cabinet front section by a plurality of screws, one of which is indicated at 48. The chassis plate 26 carries two screws 49 and 50 which connect the chassis plate 26 to the bracket 46 as shown in broken line in FIG. 4 and which release the chassis plate 26 from the bracket when the screws are backed-off as shown in full line in FIG. 4. The rear section back wall 30 has openings, one of which is shown at 50*a*, to permit access to screws 49 and 50.

As shown in FIG. 5, illustrating one of the hinges 12 and 13, a hinge pin 51 is carried by the chassis plate bracket 27 and the cabinet front section 10 has a downturned edge 52 partially surrounding the hinge pin 51 while the cabinet rear section 11 has a down-turned edge 53 partially surrounding the hinge pin 51. Each of the cabinet sections are slotted to permit the edge of the other section to pass about the hinge pin 51. Upon release of the chain 31 from connecting relation between the two cabinet sections, additional pivoting of one cabinet section relative to the other turns the cabinet section a sufficient amount whereby the turned-over edge thereof may be released from the hinge pin by raising movement thereof. This permits more complete access to either side of the chassis 25.

With the cabinet structure disclosed herein, a set owner may exchange vacuum tubes without a service call by releasing the fasteners 42, 49 and 50 to permit movement of the chassis 25 and the cabinet rear section 11 to the position shown in full line in FIG. 4. A suitable interlock switch (not shown) is provided between cabinet sections to open the circuit of the set to avoid any shock hazard. This operation still has not exposed the wiring at the other side of the chassis plate 26. This may be done by release of bolts 43. If the cabinet is closed and it is desired to have access to the wiring, the fasteners 42 are released and, additionally, the bolts 43 which results in the chassis 25 remaining connected to the cabinet front section 10, while permitting the cabinet rear section 11 to move to the full line position of FIG. 4. This position of the chassis is shown in broken line in FIG. 4.

We claim:

1. A television set having a cabinet formed of front and rear sections pivotally movable relative to each other, a picture tube mounted in said front section, a chassis member pivotally disposed generally upright within the cabinet and having vacuum tubes on one side extending toward the picture tube, means defining an opening in said member whereby the member may encircle a neck of the picture tube, and means mounting said chassis member for pivotal movement away from the picture tube to permit access to said vacuum tubes.

2. A cabinet as defined in claim 1 in which said member has easily replaceable components mounted on one of said sides and electrical wiring on the other side.

3. A television set as defined in claim 1 in which said chassis member has electrical wiring on the side thereof opposite the side having said vacuum tubes.

4. A television set having a cabinet with front and rear sections hinged together at their bottom for relative movement to expose the interior of the cabinet, a generally upright chassis member hingedly connected to said cabinet sections, first releasable fastening means for holding said cabinet sections closed including a foraminous screen across the top of the cabinet, second releasable fastening means interconnecting said chassis member and front section including a bracket supported by the front section, and third releasable fastening means interconnecting said chassis member and rear section, and means defining openings in the rear section permitting access to said second releasable means whereby release thereof and the first releasable fastening means permits pivotal movement of the chassis member and rear section relative to the front section, said third releasable fastening means being operable from the rear of the set whereby release thereof and said first releasable fastening means permits pivotal movement of the rear section relative to the front section and the chassis member.

5. A television set having a pair of cabinet sections pivotally connected together to form a cabinet with a picture tube mounted therein to one of said sections, a chassis member pivotally connected to said cabinet sections and having a generally up and down disposition within the cabinet, means defining a clearance opening in said chassis member to encircle the neck of the picture tube, means for releasably connecting the chassis member to one of said cabinet sections, said last-named means being releasable from the outside of the cabinet whereby opening of the cabinet exposes one side of the chassis member, means for releasably connecting the chassis member to the other of said cabinet sections said last-named means being releasable from the outside of the cabinet whereby opening of the cabinet exposes another side of the chassis member, and releasable means for maintaining said cabinet sections in cabinet closed position.

6. A cabinet with front and rear sections hinged together at their bottom for relative movement to expose the interior of the cabinet, a generally upright chassis member hingedly connected to said cabinet sections, first releasable fastening means for holding said cabinet sections closed, second releasable fastening means interconnecting said chassis member and front section, and third releasable fastening means interconnecting said chassis member and rear section, release of said second releasable means and the first releasable fastening means permitting pivotal movement of the chassis member and rear section relative to the front section, release of said third releasable fastening means and said first releasable fastening means permitting pivotal movement of the rear section relative to the front section and the chassis member and all three of said releasable means being operable from the cabinet exterior.

7. A television set having a cabinet formed of front and rear sections connected relative to each other, a picture tube mounted in said front section, a chassis member movably disposed generally upright within the cabinet and having vacuum tubes on one side extending toward the picture tube, means defining an opening in said member whereby the member may encircle a neck of the picture tube, and means accessible from the cabinet exterior mounting said chassis member for either retention with the front section or movement away from the picture tube with the rear section to permit access to said vacuum tubes.

8. A television set having a pair of releasably interconnected cabinet sections forming a cabinet with a picture tube with a neck mounted therein to one of said sections, a chassis member releasably connected to said cabinet sections and having a generally up and down disposition within the cabinet, means defining a clearance opening in said chassis member to encircle the picture tube, means operable from the cabinet exterior for releasing the chassis member from one of said cabinet sections said chassis member being still connected to the other of said cabinet sections whereby opening of the cabinet exposes one side of the chassis member, means operable from the cabinet exterior for releasing the chassis member from the other of said cabinet sections said chassis member being still connected to the first of said cabinet sections whereby opening of the cabinet exposes another side of the chassis member, and releasable means for maintaining said cabinet sections in cabinet closed position.

9. A cabinet for housing electrical equipment comprising, a pair of cabinet sections hingedly connected together for relative movement between open and closed positions, an internal mounting member for the electrical equipment hingedly connected to said cabinet sections and disposed generally upright within the cabinet, and releasable means accessible from the cabinet exterior for alternately connecting said member with either of said cabinet sections whereby one side or the other of said member is exposed when the cabinet is open.

References Cited by the Examiner

UNITED STATES PATENTS

| | | | |
|---|---|---|---|
| 2,559,353 | 7/51 | Fisch | 178—7.82 |
| 2,750,587 | 6/56 | Nicholson | 178—7.82 |
| 2,917,577 | 12/59 | Harman | 178—7.8 |
| 2,947,811 | 8/60 | Archer | 178—7.9 |
| 2,986,600 | 5/61 | Pifer | 178—7.9 |

FOREIGN PATENTS

| | | |
|---|---|---|
| 512,716 | 9/39 | Great Britain. |
| 1,146,450 | 5/57 | France. |

DAVID G. REDINBAUGH, *Primary Examiner.*

STEPHEN W. CAPELLI, *Examiner.*